(12) United States Patent
Jahanian et al.

(10) Patent No.: US 8,742,851 B2
(45) Date of Patent: Jun. 3, 2014

(54) CMOS LINEAR DIFFERENTIAL DISTRIBUTED AMPLIFIER AND DISTRIBUTED ACTIVE BALUN

(75) Inventors: Amin Jahanian, Irvine, CA (US); Payam Heydari, Irvine, CA (US)

(73) Assignee: The Regents of The University of California, Oakland, CA (US)

( * ) Notice: Subject to any disclaimer, the term of this patent is extended or adjusted under 35 U.S.C. 154(b) by 41 days.

(21) Appl. No.: 13/485,710

(22) Filed: May 31, 2012

(65) Prior Publication Data
US 2013/0321080 A1 Dec. 5, 2013

(51) Int. Cl.
*H03F 3/04* (2006.01)
(52) U.S. Cl.
USPC ........................................ 330/301; 330/286

(58) Field of Classification Search
USPC ............... 330/53, 54, 98, 117, 150, 286, 301, 330/310, 311
See application file for complete search history.

(56) References Cited

U.S. PATENT DOCUMENTS

| | | | |
|---|---|---|---|
| 7,375,590 B2 * | 5/2008 | Su et al. ......................... | 330/301 |
| 7,646,250 B2 * | 1/2010 | Mun et al. ...................... | 330/301 |
| 7,692,493 B1 * | 4/2010 | Chen et al. ..................... | 330/301 |
| 7,737,789 B2 * | 6/2010 | Eisenstadt et al. ............. | 330/311 |

* cited by examiner

*Primary Examiner* — Khanh V Nguyen
(74) *Attorney, Agent, or Firm* — Kenneth S. Roberts; One LLP

(57) ABSTRACT

A CMOS distributed amplifier with distributed active input balun is disclosed. Each $g_m$ cell within the distributed amplifier employs dual-output two-stage topology that improves gain and linearity without adversely affecting bandwidth and power.

21 Claims, 11 Drawing Sheets

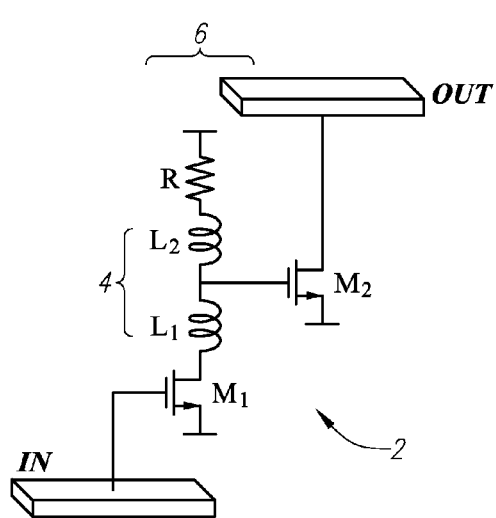
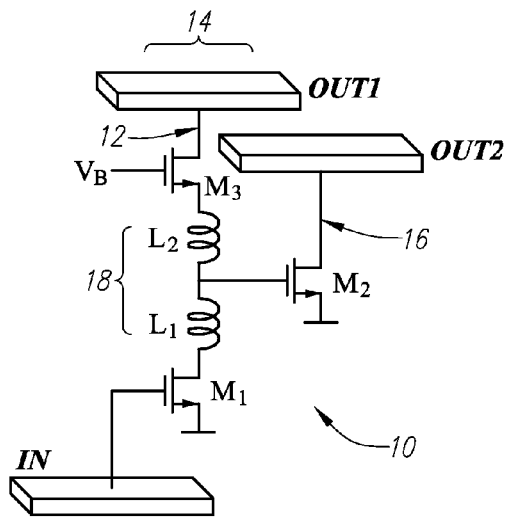
*FIG. 1*  *FIG. 2*
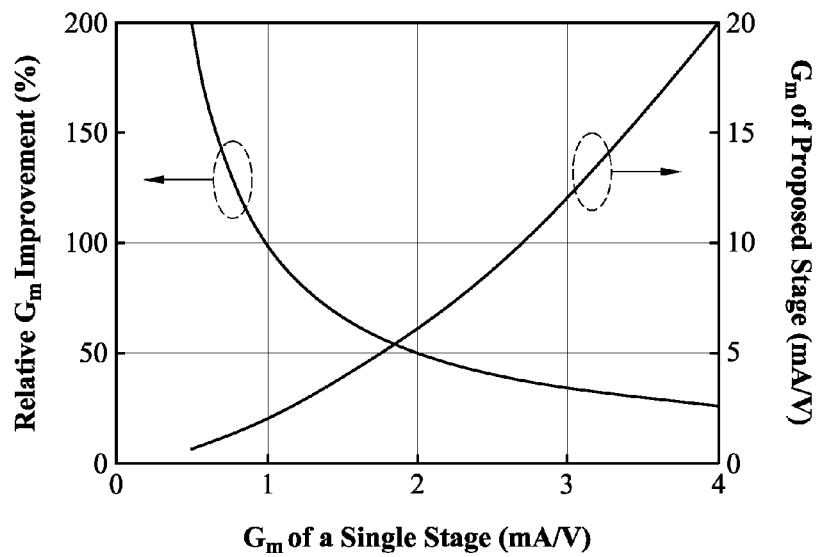
*FIG. 3*

CMOS LINEAR DIFFERENTIAL DISTRIBUTED AMPLIFIER AND DISTRIBUTED ACTIVE BALUN

STATEMENT REGARDING FEDERALLY SPONSORED RESEARCH OR DEVELOPMENT

This invention was made with Government support under Grant No. ECS0449433, awarded by the National Science Foundation. The Government has certain rights in this invention.

FIELD OF THE INVENTION

This patent application relates in general to linear differential distributed amplifiers, and more specifically to CMOS linear differential distributed amplifiers and distributed active input baluns using gain bandwidth and linearity enhancing techniques.

BACKGROUND OF THE INVENTION

Distributed amplifiers (DAs) have been used extensively for broadband wired/wireless applications. Various techniques, examined in different technologies, have been proposed by prior work to improve distributed amplifiers' performance parameters such as gain, bandwidth (BW), and power. Multistage cells are used to improve gain, while interstage inductive peaking is employed to compensate for the bandwidth degradation due to interstage poles of the cell (see J. C. Chien and L. H. Lu, "40-Gb/s High-Gain Distributed Amplifiers With Cascaded Gain Stages in 0.18-Rm CMOS," IEEE J. Solid-State Circuits, vol. 42, pp. 2715-2725, December 2007).

Distributed circuits are also implemented in the context of active single-to-differential conversion (i.e., active baluns). Implemented using either active or passive components, baluns are useful for various applications, such as broadband wired connectivity and high-frequency general-purpose test and measurement equipment. Active baluns offer the advantage of achieving voltage and power gain of higher than (or around) unity, as well as a higher reverse isolation over their passive counterparts.

To improve gain in distributed amplifiers and distributed circuits, multi-stage transconductance ($g_m$) stage have been suggested. However, only the output of the last $g_m$ stage was used as an output, and the signal on the output of other stages was dissipated on the resistive load.

Accordingly, improved distributed amplifier and distributed circuits designs capable of improving the overall gain without degrading bandwidth, thereby improving the overall gain-bandwidth (GBW) and linearity are needed.

BRIEF SUMMARY OF THE EMBODIMENTS

Distributed amplifiers and distributed active input baluns suitable for broadband wireless/wired communication links are provided. A novel two-stage dual-output $g_m$ cell is also provided as the gain stage within the distributed amplifiers and the distributed active input baluns to improve overall voltage gain and linearity without degrading bandwidth, power consumption, and chip area.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to the require the details of the example embodiments.

BRIEF DESCRIPTION OF THE DRAWINGS

The details of the invention, both as to its structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

FIG. 1 is a schematic view of a conventional two-stage $g_m$ cell;

FIG. 2 is a schematic view of an exemplary embodiment of a two-stage dual-output $g_m$ cell;

FIG. 3 depicts a relative gain comparison between the conventional two-stage $g_m$ cell and the two-stage dual-output $g_m$ cell of FIG. 2

DETAILED DESCRIPTION OF EXEMPLARY EMBODIMENTS

Figure 4:
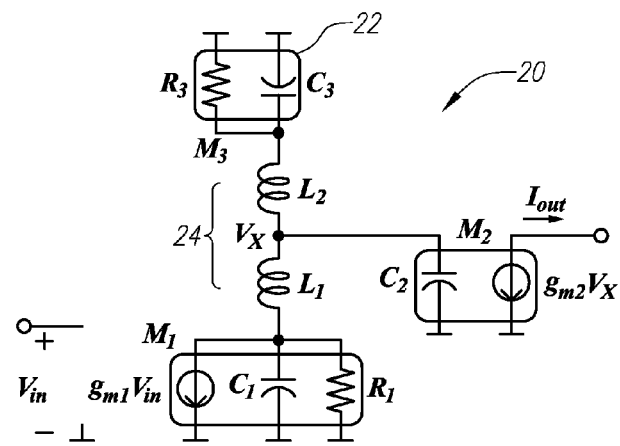
FIG. 4 is a schematic view of a simplified equivalent small-signal model of the exemplary embodiment of the two-stage dual-output $g_m$ cell of FIG. 2.

FIG. 1 is a schematic view of a conventional two-stage $g_m$ cell 2. The two-stage $g_m$ cell 2 in FIG. 1 increases the overall transconductance from $g_{m1}$ (for a single stage $g_m$ cell) to $g_{m1}g_{m2}R$, wherein $g_{m2}R>1$ guarantees gain improvement compared to a single-stage $g_m$ cell. The bandwidth-limiting interstage pole of the $g_m$ cell 2 is compensated using an inductive-peaking-based bandwidth-enhancement network 4, comprising $L_1$-$L_2$. However, the amplified signal power on the resistive drain load R of the first stage 6 can be totally wasted and not be utilized to improve performance.

FIG. 2 is a schematic view of an exemplary embodiment of a two-stage dual-output $g_m$ cell 10. The two-stage dual-output $g_m$ cell 10 has one input IN and two outputs OUT1 and OUT2. The issue of wasting the amplified signal power on the resistive drain load R of the first stage 6 of the two-stage $g_m$ cell 2 of FIG. 1 can be mitigated in the two-stage dual-output $g_m$ cell 10 of FIG. 2 by replacing the resistive drain load R of FIG. 1 with a transistor $M_3$ to introduce an additional signal path 12. Transistor $M_3$ acts as a cascode device for IN-OUT1 signal path 12, while behaving similar to a resistive load (with $R=1/g_{m3}$) for the first stage 14 of the IN-OUT2 signal path 16. Assuming that output signals from outputs OUT1 and OUT2 are summed constructively (as will be shown below), let $g_{m1}$, $g_{m2}$ and $g_{m3}$ correspond to the transconductance of transistors $M_1$, $M_2$ and $M_3$, respectively, the overall transconductance of the two-stage dual-output $g_m$ cell 10, $G_m$, thus becomes $$G_m = \frac{g_{m1}}{g_{m3}} \cdot g_{m2} + g_{m1} \quad (1)$$

wherein the first and second terms on the right-hand side represent the equivalent transconductance of IN-OUT2 signal path 16 and IN-OUT1 signal path 12, respectively. The addition of the second term indicates gain improvement over the conventional two-stage $g_m$ cell 2 of FIG. 1.

FIG. 3 depicts a relative gain comparison between the conventional two-stage $g_m$ cell 2 and the two-stage dual-output $g_m$ cell 10 of FIG. 2 with its gain expression in Equation (1). The percentage of relative gain of the conventional two-stage $g_m$ cell 2 is on the left y-axis and the gain expression in Equation (1) is on the right y-axis in terms of the gain of a single stage. For these plots, it is assumed that $g_{m1}=g_{m2}$ and $g_{m1}=1/R$, for simplicity. FIG. 3 shows a gain improvement of 20%-100% compared to the conventional two-stage $g_m$ cell 2 for gain values achievable by a single stage in a nanoscale CMOS process. This gain improvement comes at no extra power consumption and bandwidth degradation, as will be shown below.

In FIG. 2, the IN-OUT1 signal path 12 is similar to a cascode stage with an $L_1$-$L_2$ bandwidth-enhancement circuit 18 added to remove the cascode pole. The IN-OUT2 signal path 16, however, is different from that of the two-stage $g_m$ cell 2 of FIG. 1 in that resistor R is replaced by transistor $M_3$ of FIG. 2.

FIG. 4 is a schematic view of a simplified equivalent small-signal model 20 of the two-stage dual-output $g_m$ cell 10 of FIG. 2 for showing the effect of transistor $M_3$ on bandwidth. In FIG. 4, the input impedance of transistor $M_3$ seen through its source terminal can be modeled with a parallel RC circuit $R_3$-$C_3$ 22. Transistor $M_1$ can be modeled by its transconductance $g_{m1}$, drain capacitance $C_1$, and drain-source resistance $R_1$. Transistor $M_2$ can be modeled by its transconductance $g_{m2}$ and gate capacitance $C_2$. Transistor $M_3$ can be modeled by its $R_3$-$C_3$ circuit 22 (where resistor $R_3=1/g_{m3}$). The gate capacitance of transistor $M_1$ and the drain capacitance of transistor $M_2$ are absorbed into the transmission lines and can be removed from the model.

Figure 5:
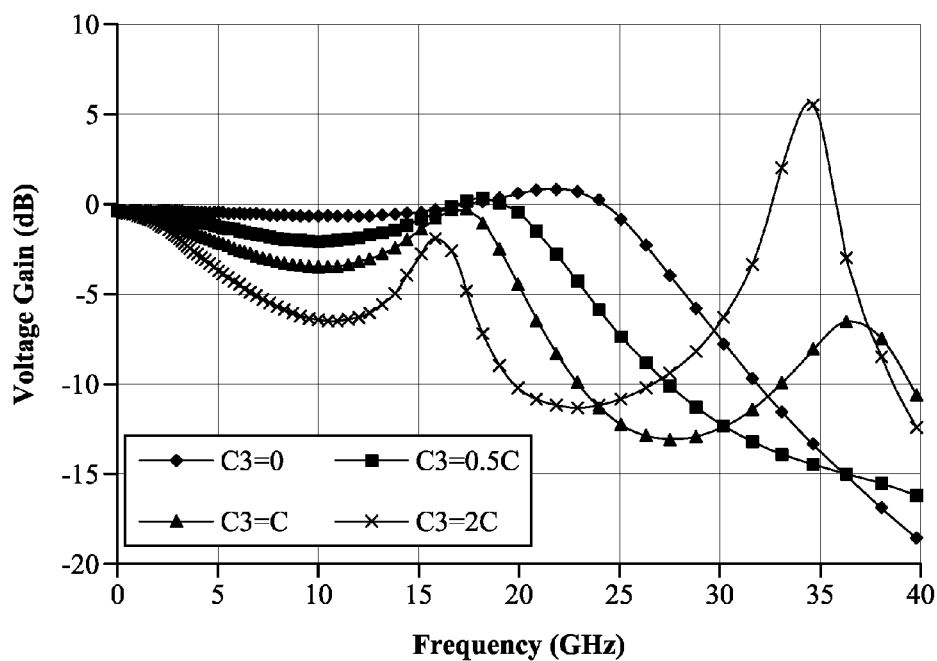
FIG. 5 depicts a result of SPICE simulations for showing the effect of transistor $M_3$ source capacitance variation on frequency response.

FIG. 5 depicts a result of SPICE simulations for showing the effect of transistor $M_3$ source capacitance (i.e., $C_3$) variation on frequency response. For these simulations, $g_{m1}=g_{m2}=20$ mA/V, $C_1=C_2=200$ fF, $R_1=1$ kΩ, $R_3=50$Ω, and the output current is terminated through a 50Ω resistive load. The bandwidth-enhancement network ($L_1=500$ pH and $L_2=200$ pH) 24 is designed for the case where no transistor source capacitance $C_3$ exists. FIG. 5 shows that as the transistor source capacitance $C_3$ takes on larger values, the voltage-gain's frequency response experiences increasingly more ripple and bandwidth degradation.

Figure 6A:
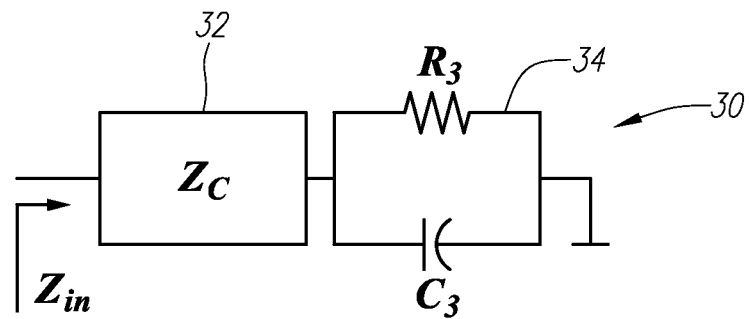
FIG. 6(a) is a schematic view of a bandwidth compensation network, wherein impedance $Z_c$ is added in series with the $R_3$-$C_3$ circuit of transistor $M_3$ to mitigate the effects of transistor source capacitance $C_3$.

FIG. 6(a) is a schematic view of a bandwidth compensation network 30, wherein compensation impedance $Z_c$ 32 is added in series with the $R_3$-$C_3$ circuit 34 of transistor $M_3$ to mitigate the effects of transistor source capacitance $C_3$. The input impedance, $Z_{in}$, then becomes $$Z_{in} = Z_c + \frac{R_3}{1 + jR_3C_3\omega}, \quad (2)$$

If compensation impedance $Z_c$ is synthesized such that the effective input impedance $Z_{in}$ seen into the source of transistor $M_3$ is purely resistive, i.e., $Z_{in}=R_3$, the effect of transistor source capacitance $C_3$ will have been fully compensated. Using this notion in rearranging Equation (2), we will have $$Zc = \frac{1}{\frac{1}{R_3} + \frac{1}{jR_3^2C_3\omega}}, \quad (3)$$

Figure 6B:
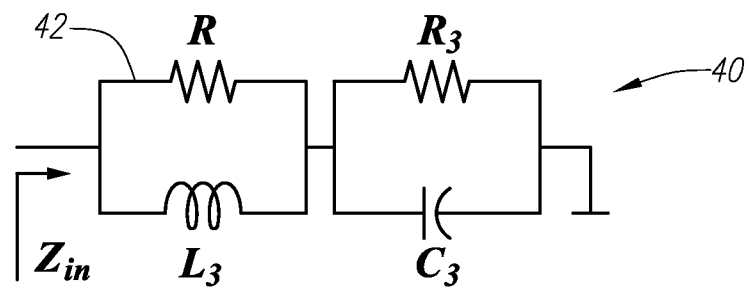
FIG. 6(b) is a schematic view of a bandwidth compensation network, wherein the impedance $Z_c$ is realized by a parallel R-L circuit.

Compensation impedance $Z_c$ can be realized using a parallel R-L circuit 42, as indicated in the bandwidth compensation network 40 of FIG. 6(b), with $$R=R_3=1/g_{m3}$$

$$L_3=R_3^2C_3, \quad (4)$$

Figure 7A:
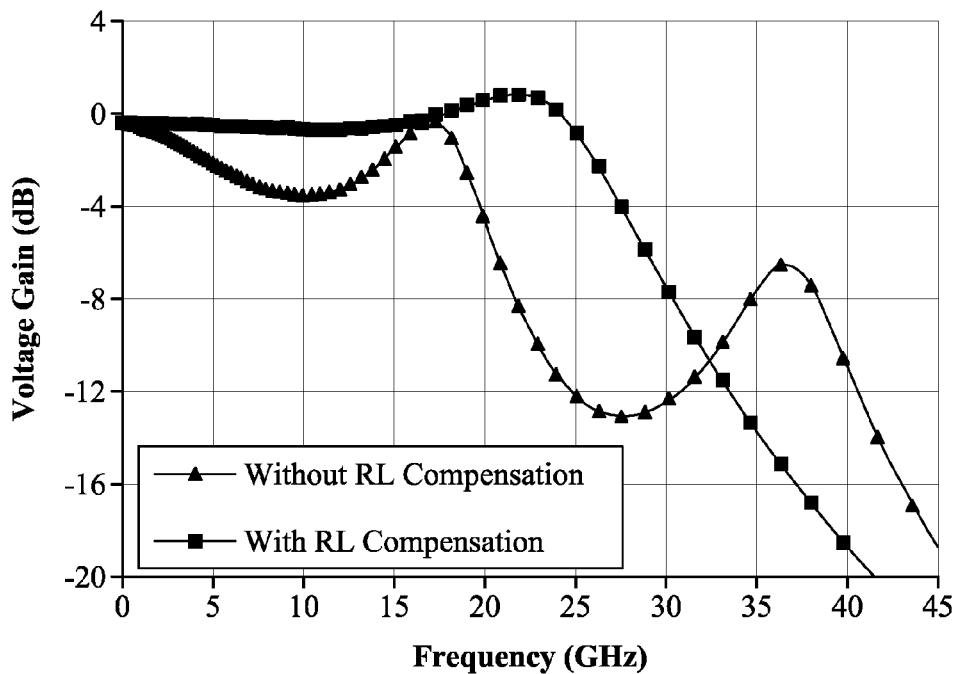
FIG. 7(a) depicts a result of SPICE simulations for showing the effect of adding the parallel R-L compensation circuit to the circuit of FIG. 4.

FIG. 7(a) depicts a result of SPICE simulations for showing the effect of adding the parallel R-L compensation circuit 42 to the circuit model 20 of FIG. 4. It is evident from FIG. 7(a) that the R-L circuit 42 compensates for the degrading effect of transistor $M_3$ parasitic capacitance, and restores the frequency response of the two-stage $g_m$ cell 10 when there is no parasitic effect of transistor source capacitance $C_3$.

An important consideration is the sensitivity of the transfer function with respect to resistor R and inductor L values of the bandwidth compensation network 40 of FIG. 6(b). The sensitivity of input impedance $Z_{in}$ in FIG. 6(b) with respect to variation in R-L values in Equation (4) can be obtained by accounting for relative resistive and inductive offset errors γ and δ, respectively. Assuming that $R=R_0(1+\gamma)$ and $L_3=R_0^2C$ (1+δ) in Equation (3), the relative impedance error, η, defined as $$\eta = \frac{Z_{in} - R_0}{R_0} \quad (5)$$

can be found, after removing second-order errors (i.e., γ, δ<<1)

$$|\eta| \approx \frac{R_0 C \omega \sqrt{\delta^2 + \gamma^2 R_0^2 C^2 \omega^2}}{\sqrt{1 + 2\gamma + 2R_0^2 C^2 \omega^2 (1 + \delta + \gamma) + (1 + 2\delta) R_0^4 C^4 \omega^4}}. \quad (6)$$

At very low frequencies where ω<<1/R$_3$C$_3$, Equation (6) can be simplified to $$|\eta| \approx \frac{\delta}{1 + \gamma} RC\omega \quad (7)$$

and at higher frequencies where ω>>1/R$_3$C$_3$, Equation (6) becomes $$|\eta| \approx \frac{\gamma}{1 + \delta}. \quad (8)$$

Equations (7) and (8) show that variation in the absolute value of input impedance $Z_{in}$ is roughly proportional, to the first degree, to resistive and inductive offset errors.

Figure 7B:
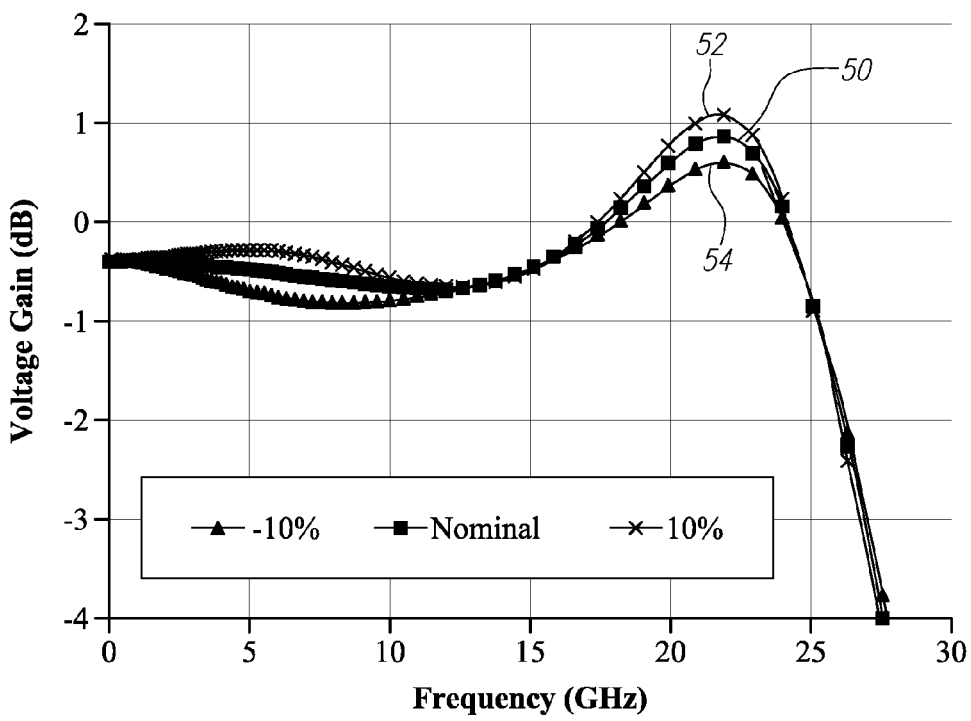
FIG. 7(b) depicts a result of SPICE simulations for showing the effect of varying the inductor $L_3$ on the overall transfer function.

FIG. 7(b) depicts a result of SPICE simulations for showing the effect of varying the inductor L$_3$ of FIG. 6 on the overall transfer function. In FIG. 7(b), the inductance is varied by ±10% of its nominal value. The frequency response, shown via line 50 for the nominal value, line 52 for minimum the value, and line 54 for the maximum value, respectively. These lines 50, 52, 54 show negligible sensitivity of the frequency response to inductor L$_3$ variation. Similarly, low sensitivity is observed with respect to the resistance variation in the parallel R-L circuit 42 of FIG. 6.

Figure 8:
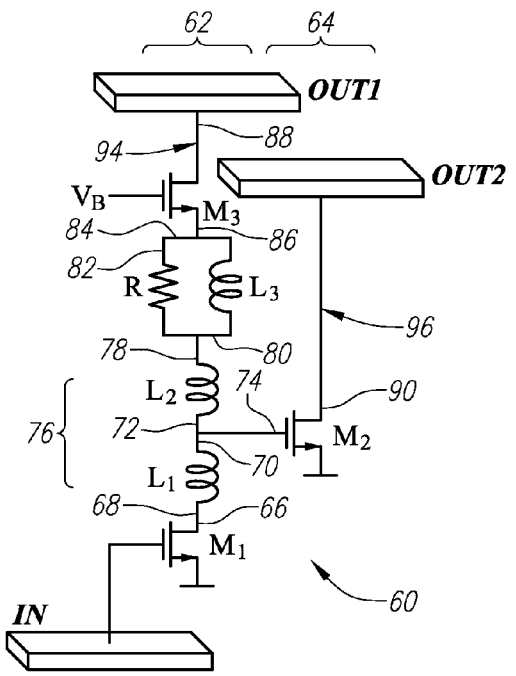
FIG. 8 is a schematic view of an exemplary embodiment of a two-stage dual-output $g_m$ cell with R-L compensation.

FIG. 8 is a schematic view of an exemplary embodiment of a two-stage dual-output g$_m$ cell 60 with R-L compensation. The two-stage dual-output g$_m$ cell 60 includes a first stage 62 and a second stage 64. The two-stage dual-output g$_m$ cell 60 also includes one input IN and two outputs OUT1 and OUT2. In this exemplary embodiment, the first stage 62 includes a transistor M$_1$ with its gate coupled to input IN. The drain 66 of transistor M$_1$ coupled to a first end 68 of a first inductor L$_1$. The second end 70 of inductor L$_1$ coupled to a first end 72 of a second inductor L$_2$. The inductors L$_1$ and L$_2$ form an bandwidth-enhancement network 76. The second end 78 of inductor L$_2$ coupled to a first end 80 of a parallel R-L circuit 82. The parallel R-L circuit 82 includes resistor R and inductor L$_3$ connected in parallel to form a compensation network as described previously in connection with FIG. 6. The second end 84 of the parallel R-L circuit 82 coupled to the source 86 of transistor M$_3$. The gate of transistor M$_3$ is biased by V$_B$. The drain 88 of transistor M$_3$ coupled to the first output OUT1 of the two-stage dual-output g$_m$ cell 60. On the second stage 64, the gate 74 of transistor M$_2$ coupled to the second end 70 of inductor L$_1$ (and also the first end 72 of inductor L$_2$). The drain 90 of transistor M$_2$ coupled to the second output OUT2 of the two-stage dual-output g$_m$ cell 60. The source of transistor M$_1$ and transistor M$_2$ can be ties tied to ground.

The resulting dual-output g$_m$ cell 60 with R-L compensation circuit 82 of FIG. 8 has the same bandwidth as that of the two-stage g$_m$ cell 2 of FIG. 1. Additionally, the gain improvement (see Equation (1)) provided by this dual-output g$_m$ cell 60 results in an increase in gain-bandwidth (GBW) compared to conventional two-stage g$_m$ cells.

In the exemplary embodiment of the dual-output g$_m$ cell 60 with parallel R-L compensation depicted in FIG. 8, the drain 66 of transistor M$_1$ sees two paths provided by common-source (CS) and common-gate (CG) stages transistor M$_2$ and transistor M$_3$, resulting in an ideally 180° phase shift between outputs OUT1 and OUT2.

In the exemplary embodiment of the dual-output g$_m$ cell 60 of FIG. 8, transistor M$_3$ can easily be sized such that 1/g$_{m3}$ is equal (or close to) the drain resistance R in FIG. 1. Moreover, the parallel R-L circuit 82 does not affect the dc bias at all, and the gate of transistor M$_3$ can be biased at a dc voltage high enough to ensure that two stacked gate-source voltages V$_{GS2}$ and V$_{GS3}$ both stay above V$_{TH}$, given that the supply voltage is 1.3V. Consequently, the g$_m$ cell 60 can be designed, sized, and biased similar to the conventional two-stage g$_m$ cell 2. This means that no additional power is needed to achieve the gain improvement described by Equation (1).

As for chip area, replacing the drain resistance R with transistor M$_3$ has a negligible effect on area. This is because the overall area is dominated by passive elements (especially the gate/drain transmission lines) rather than transistor sizes. The R-L circuit 82 added to the dual-output g$_m$ cell 60 does not occupy a large area either, as R and L$_3$ values, in the exemplary embodiment, can be in the order of 50Ω and 35-72 pH, respectively. The dual-output g$_m$ cell 60 of FIG. 8, therefore, occupies approximately the same size and consumes almost the same power as the conventional g$_m$ cell 2 of FIG. 1.

Transistor M$_1$ in the exemplary embodiment of the dual-output g$_m$ cell 60 of FIG. 8 can be biased from the dc voltage applied through the gate transmission-line, and transistor M$_2$ can be biased by carefully selecting V$_B$. In this embodiment, V$_B$=V$_{GS3}$+V$_{GS2}$. Using this voltage relationship, and by expressing V$_{GS,k}$ in terms of (W/L)$_k$ and g$_{m,k}$ for k=1, 2, 3; and considering that I$_1$=I$_3$, we have $$g_{m1} + \frac{\sqrt{W_1 W_3}}{W_2} g_{m2} = \mu_n C_{ox} \frac{\sqrt{W_1 W_3}}{L} (V_B - 2V_{TH}). \quad (9)$$

wherein W$_1$, W$_2$ and W$_3$ correspond to the gate width of transistors M$_1$ M$_2$ and M$_3$, respectively, while L corresponds to the gate length of transistors M$_1$ M$_2$ and M$_3$.

The right-hand side of Equation (9) is a function of V$_B$ and NMOS transistor's parameters, and is a constant with respect to device operating points. On the other hand, using Equation (1) and considering once again that I$_1$=I$_3$, the overall transconductance G$_m$ of the exemplary embodiment of the dual-output g$_m$ cell 60 can be rewritten as $$G_m = g_{m1} + \sqrt{\frac{W_1}{W_3}} g_{m2}. \quad (10)$$

Comparing Equation (9) and Equation (10) reveals that the left-hand side of Equation (9) and the right-hand side of Equation (10) will be identical if W$_2$=W$_3$. Hence, the overall G$_m$ will stay constant even in the presence of variations in g$_{m1}$ and $g_{m2}$. In other words, as the drain currents fluctuate away from their bias values due to large-signal input voltage, the $g_m$'s will change in such a way that $G_m$ stays intact. This large signal constant-$g_m$ characteristic results in improvement in linearity.

This phenomenon can be analyzed using the square-law I-V relation of MOS transistors. The following notations are introduced so as to make it easier to follow the forthcoming analysis. DC biasing signals are represented with uppercase letters and uppercase indices (e.g., $V_{GS1}$), and small-signal ac signals are represented with lowercase letters and lowercase indices (e.g., $v_{gs1}$). The sum of these two components is represented using lowercase letters with uppercase indices (e.g., $v_{GS1}$). The NMOS I-V characteristic is expressed as $i_D = KW(v_{GS}-V_{TH})^2$, where constant common parameters are grouped together in the form of $K=\mu_n C_{ox}/L$.

Figure 9A:
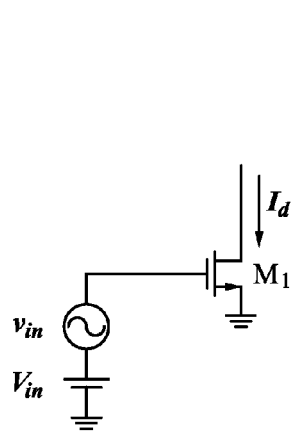
FIG. 9(a) is a schematic view of a low-frequency circuit model for a conventional CS stage.
Figure 9B:
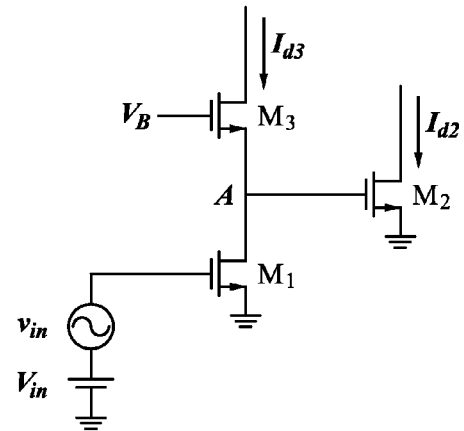
FIG. 9(b) is a schematic view of a low-frequency circuit model for the dual-output $g_m$ cell of FIG. 8.

FIG. 9(a) is a schematic view of a low-frequency circuit model for a conventional CS stage. FIG. 9(b) is a schematic view of a low-frequency circuit model for the exemplary embodiment of the dual-output $g_m$ cell 60 of FIG. 8. For the CS stage of FIG. 9(a), the small-signal drain current, $i_d$, can be expressed as a function of gate-source voltage ($v_{IN}=V_{IN}+v_{in}$)

$$i_d = \tfrac{1}{2}KWv_{in}^2 + KWv_{in}(V_{IN}-V_{TH}). \tag{11}$$

Assuming that $v_{in}=V_{ac}\cos\omega t$, Equation (11) can be written as $$i_d = \tfrac{1}{4}KWv_{ac}^2(1+\cos 2\omega t) + KWv_{ac}(V_{IN}-V_{TH})\cos\omega t. \tag{12}$$

Consequently, the ratio between second and fundamental harmonic amplitudes in a CS stage, $\alpha_{CS}$, is $$\alpha_{CS} = \frac{1}{4}\left|\frac{V_{ac}}{V_{IN}-V_{TH}}\right|. \tag{13}$$

For the $g_m$ cell 60 of FIG. 9(b), the drain currents can be found using (11)

$$i_{d1} = \tfrac{1}{2}KW_1 v_{in}^2 + KW_1 v_{in}(V_{IN}-V_{TH})$$

$$i_{d2} = \tfrac{1}{2}KW_2 v_a^2 + KW_2 v_a(V_A-V_{TH})$$

$$i_{d3} = \tfrac{1}{2}KW_3(-v_a)^2 + KW_3(-v_a)(V_B-V_A-V_{TH}). \tag{14}$$

Using the relations $$v_a/v_{in} = -g_{m1}/g_{m3} = -\sqrt{W_1/W_3} \text{ and } i_{d3}=i_{d1},$$

Equation (14) can be rearranged in order to find the overall output current $i_{out}=i_{d3}-i_{d2}$ as a function of input voltage $$i_{out} = K\sqrt{W_1}\, v_{in}\left[\sqrt{W_3}(V_B-V_A-V_{TH}) + \frac{W_2}{\sqrt{W_3}}(V_A-V_{TH})\right] + \tfrac{1}{2}KW_1 v_{in}^2\left(1-\frac{W_2}{W_3}\right). \tag{15}$$

$v_{in} = V_{ac}\cos\omega t$ yeilds $$i_{out} = K\sqrt{W_1}\, V_{ac}\cos\omega t\left[\sqrt{W_3}(V_B-V_A-V_{TH}) + \frac{W_2}{\sqrt{W_3}}(V_A-V_{TH})\right] + \tfrac{1}{4}KW_1 V_{ac}^2\left(1-\frac{W_2}{W_3}\right)(1+\cos 2\omega t). \tag{16}$$

From Equation (16), the ratio of the second to the fundamental harmonics $\alpha_{lin}$ for the $g_m$ cell 60 can be $$\alpha_{lin} = \left|\frac{1}{4}\frac{V_{ac}\sqrt{W_1 W_3}(1-W_2/W_3)}{W_3(V_B-V_A-V_{TH})+W_2(V_A-V_{TH})}\right|. \tag{17}$$

Referring to Equation (17), maximum linearity can be achieved when the second harmonic (numerator) vanishes. This occurs when $W_2=W_3$, which verifies the conclusion made earlier through intuitive analysis.

While equal aspect ratios for transistor $M_2$ and transistor $M_3$ of the dual-output $g_m$ cell 60 of FIG. 8 results in maximum linearity, higher gain improvement can be achieved for larger $1/g_{m3}$, i.e., $W_2 > W_3$, at the expense of reduced linearity improvement. Therefore, design solutions for maximum gain improvement and maximum linearity improvement differ from each other, indicating that a tradeoff exists between gain and linearity improvements for this topology.

To delve deeper into this notion, the linearity of the dual-output $g_m$ cell 60 (for $W_2 > W_3$) and conventional CS stage are compared. For simplicity, in Equation (17), all devices are assigned the same overdrive voltage, $V_{OD}$. Moreover, $W_2 = pW_3$ (with $p>1$ to achieve voltage gain) and $W_1 = qW_3 \alpha_{CS}$ have been selected. Therefore, $\alpha_{lin}$ can become $$\alpha_{CS} = \frac{1}{4}\frac{V_{ac}}{V_{OD}} \tag{18}$$

$$\alpha_{lin} = \frac{1}{4}\sqrt{q}\,\frac{V_{ac}}{V_{OD}}\left|\frac{p-1}{p+1}\right|.$$

The linearity improvement ratio between the dual-output $g_m$ cell 60 of FIG. 8 and the CS stage 2 of FIG. 1, defined as $\alpha_{imp}=\alpha_{CS}/\alpha_{lin}$, can be $$\alpha_{imp} = \frac{1}{\sqrt{q}}\left|\frac{p+1}{p-1}\right|. \tag{19}$$

For values of q close to 1 (which improves the frequency behavior of $g_m$ cells in high-frequency distributed amplifiers), the condition $p>1$ ensures that $\alpha_{imp}$ is larger than unity. Consequently, the topology shown in FIG. 8 does improve linearity even when it is optimized for gain improvement. For instance, for $W_2=1.5W_3=1.5W_1$ (p=1.5 and q=1), a linearity improvement of 5 can be achieved. For more gain improvement, (e.g., p=2 and q=1), linearity improvement drops to 3, verifying tradeoff between gain and linearity improvements.

To simulate linearity of the topology shown in FIG. 8, a conventional cascode $g_m$ cell 2 of FIG. 1 and the dual-output $g_m$ cell 60 of FIG. 8 were designed for the same resistive load, voltage gain, and power consumption. Simulations were conducted to extract output-referred 1-dB compression ($OP_{1dB}$) points for the two structures. Both $g_m$ cells use the same resistive load of 50Ω with overall dc current of 8.7 mA for cascode $g_m$ cell 2 and 8.2 mA for the dual-output $g_m$ cell 60 from a 1.2-V power supply. The cascode $g_m$ cell 2 achieved a dc gain of 8.4 dB and an $OP_{1dB}$ of 2.0 dBm, whereas the dual-output $g_m$ cell 60 achieved a dc gain of 8.8 dB and an $OP_{1dB}$ of 5.5 dBm. Consequently, for this case study, the dual-output $g_m$ cell 60 achieved a 3.5-dB improvement in $OP_{1dB}$ compared with a conventional cascode $g_m$ cell 2 under similar conditions.

Figure 10:
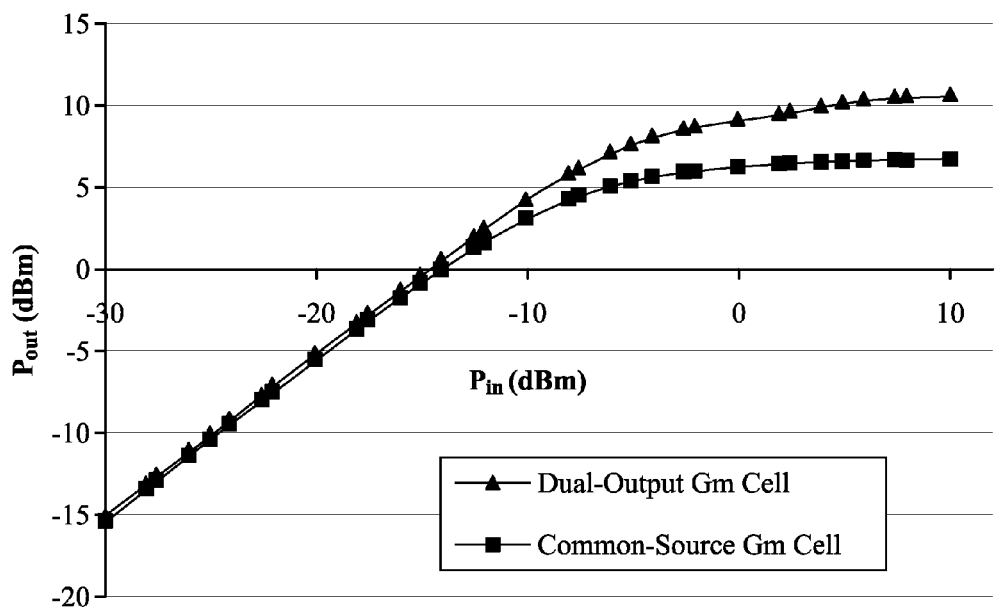
FIG. 10 depicts a result of SPICE simulations for showing the comparison curves of the conventional cascode $g_m$ cell of FIG. 1 and the dual-output $g_m$ cell of FIG. 8.

FIG. 10 depicts a result of SPICE simulations for showing the comparison curves of the conventional cascode $g_m$ cell 2 of FIG. 1 and the dual-output $g_m$ cell 60 of FIG. 8.

During design and optimization, in addition to gain and linearity requirements, other criteria need to be met, as well. For instance, making $W_2$ too large to further increase gain will make inductive peaking less effective due to excessive parasitic capacitance. In the meantime, making $W_3$ too small will lead to excessively large $V_{GS3}$, which makes $V_B = V_{GS3} + V_{GS2}$ hard to realize at nominal supply voltages around 1-1.3 V. In the exemplary embodiment of the dual-output $g_m$ cell 60 of FIG. 8, approximate values of $W_3 = 0.6 W_2$ are chosen to address these concerns.

Noise analysis for each of the two input-output paths 94, 96 of the two-stage $g_m$ cell 60 in FIG. 8 results in two different input-referred noise voltages. For the IN-OUT1 path 94, the cascode device transistor $M_3$ does not contribute to the overall noise because of the large resistive degeneration provided by transistor $M_1$ in the equivalent noise circuit model. Neither does the second stage transistor $M_2$ since it is not directly in the IN-OUT1 signal path 94. Consequently, the overall input-referred noise voltage $v_{in,1}^2$ reflects only the thermal noise component contributed by the input transistor, $M_1$ $$v_{in,1}^2 = \frac{4kT\gamma}{g_{m1}}. \tag{20}$$

However, for the IN-OUT2 signal path 96, the thermal noise components of all three transistors contribute to overall output noise power. Using superposition, the overall input-referred noise voltage $v_{in,2}^2$ can be found $$v_{in,2}^2 = \frac{4kT\gamma}{g_{m1}}\left[1 + \frac{g_{m3}^2}{g_{m1}g_{m2}} + \frac{g_{m3}}{g_{m1}}\right]. \tag{21}$$

From Equations (20) and (21), it is evident that increasing the ratio $g_{m1}g_{m2}/g_{m3}$ improves overall noise performance. This is in line with the gain performance of the $g_m$ cell. Therefore, in the gain-linearity tradeoff investigated discussed previously, improving gain results in noise improvement as well.

Figure 11:
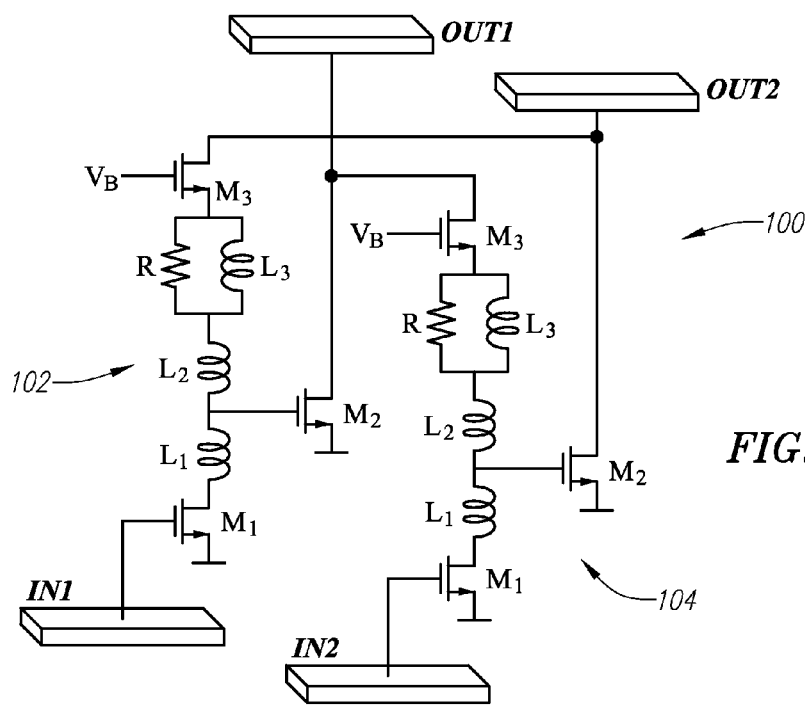
FIG. 11 is a schematic view of an exemplary embodiment of a two-stage fully differential $g_m$ cell with R-L compensation.

FIG. 11 is a schematic view of an exemplary embodiment of a two-stage fully differential $g_m$ cell 100 with R-L compensation. The fully differential $g_m$ cell 100 includes a first input IN1, a second input IN2, a first output OUT1, and a second output OUT2. The fully differential $g_m$ cell 100 also includes a first dual-output $g_m$ cell 102 and a second dual-output $g_m$ cell 104. In the present embodiment, both the first dual-output $g_m$ cell 102 and the second dual-output $g_m$ cell 104 are identical to the dual-output $g_m$ cell 60 of FIG. 8. In the present embodiment, the input of the dual-output $g_m$ cell 102 is connected to the differential input IN1, and the input of the dual-output $g_m$ cell 104 is connected to the differential input IN2. The outputs (OUT1 and OUT2) are cross-coupled to the drain of transistor $M_2$ or transistor $M_3$ in each dual-output $g_m$ cell 102, 104 as shown in FIG. 11. Therefore, each output of the resulting fully differential $g_m$ cell 100 exhibits the same $G_m$. The resulting fully differential cell 100 of FIG. 11 enjoys symmetric design and implementation, and minimal phase and amplitude distortion at its two outputs OUT1 and OUT2.

Figure 12:
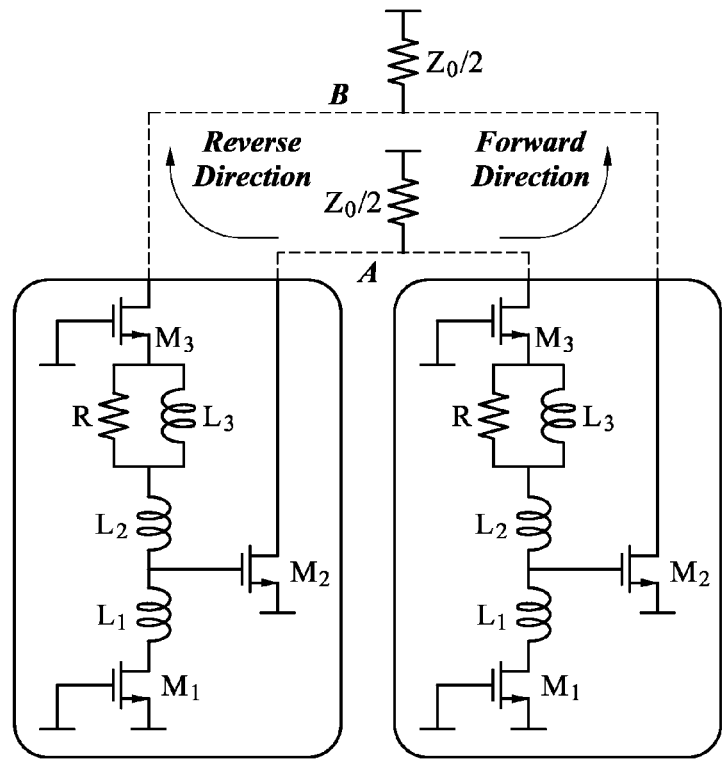
FIG. 12 is a schematic view of a signal loop of the fully differential $g_m$ cell of FIG. 11.

In the fully differential $g_m$ cell 100 of FIG. 11, a signal loop is formed due to the cross-coupled connection of two cells. FIG. 12 is a schematic view of a signal loop of the fully differential $g_m$ cell 100 of FIG. 11. The cell 100 was first expanded as seen in FIG. 12, where $Z_0$ is the characteristic impedance of the drain transmission line. The low-frequency loop gain, $A_L$, can be found from point A to point B and back to A in FIG. 12 in the forward direction (the reverse direction clearly includes considerable attenuation close to ideal isolation at low frequencies)

$$|A_L| \approx \frac{1}{4}\left(\frac{Z_0}{r_{o3}}\right)^2 \left(\frac{g_{m2}}{g_{m3}}\right)^2. \tag{22}$$

It is evident from Equation (22) that for practical CMOS amplifiers, significant attenuation exists along the loop. For instance, for $Z_0 = 50\Omega$, $r_o$ is approximately ten times larger than $Z_0$, and with $g_{m2} = 2g_{m3}$, 40-dB attenuation in the loop gain will be obtained. This amount of attenuation is far too much to lead to any unstable or close-to-unstable behavior in the amplifier in any condition, and therefore does not create instability issue for the amplifier. Eventually, the proposed $g_m$ cell follows the same stability rules as other CS-based distributed amplifiers.

Figure 13:
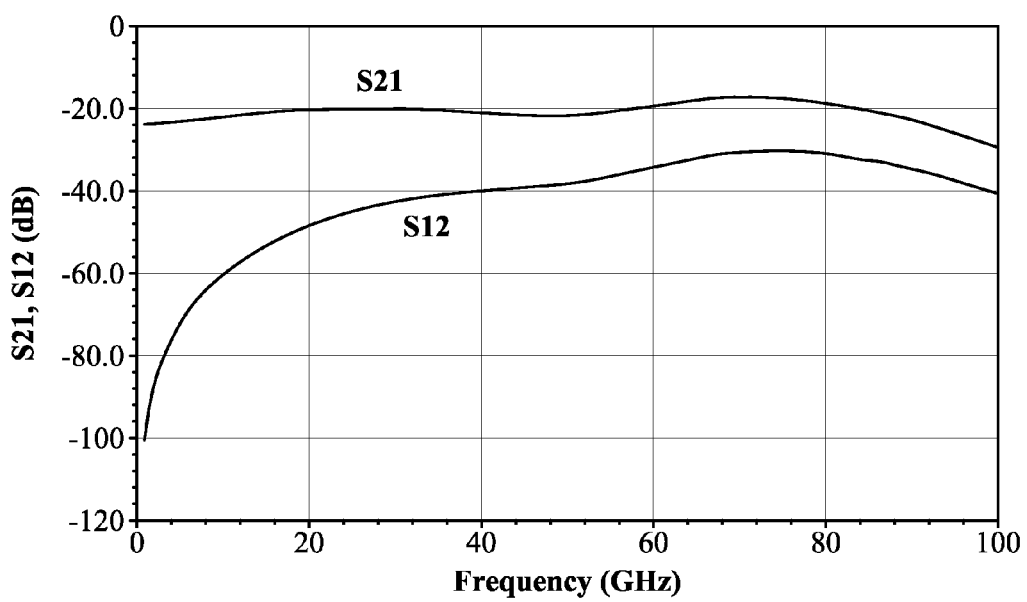
FIG. 13 depicts the simulated loop gain in the forward and reverse directions for the $g_m$ cell designed for the distributed amplifier of FIG. 11.

FIG. 13 depicts the simulated loop gain in the forward ($S_{21}$) and reverse ($S_{12}$) directions for the $g_m$ cell 100 designed for a distributed amplifier. The plots show an increasingly large reverse attenuation at dc and minimum reverse attenuation larger than 30 dB. It also shows a dc forward attenuation of 25 dB and minimum forward attenuation of 18 dB across the bandwidth of around 80 GHz.

The ideally differential outputs of the dual-output $g_m$ cell 60 in FIG. 8 makes it suitable for a: 1) distributed balun and 2) distributed fully differential distributed amplifier (DDA) incorporating symmetric cross-coupled $g_m$ cells of FIG. 11.

Figure 14:
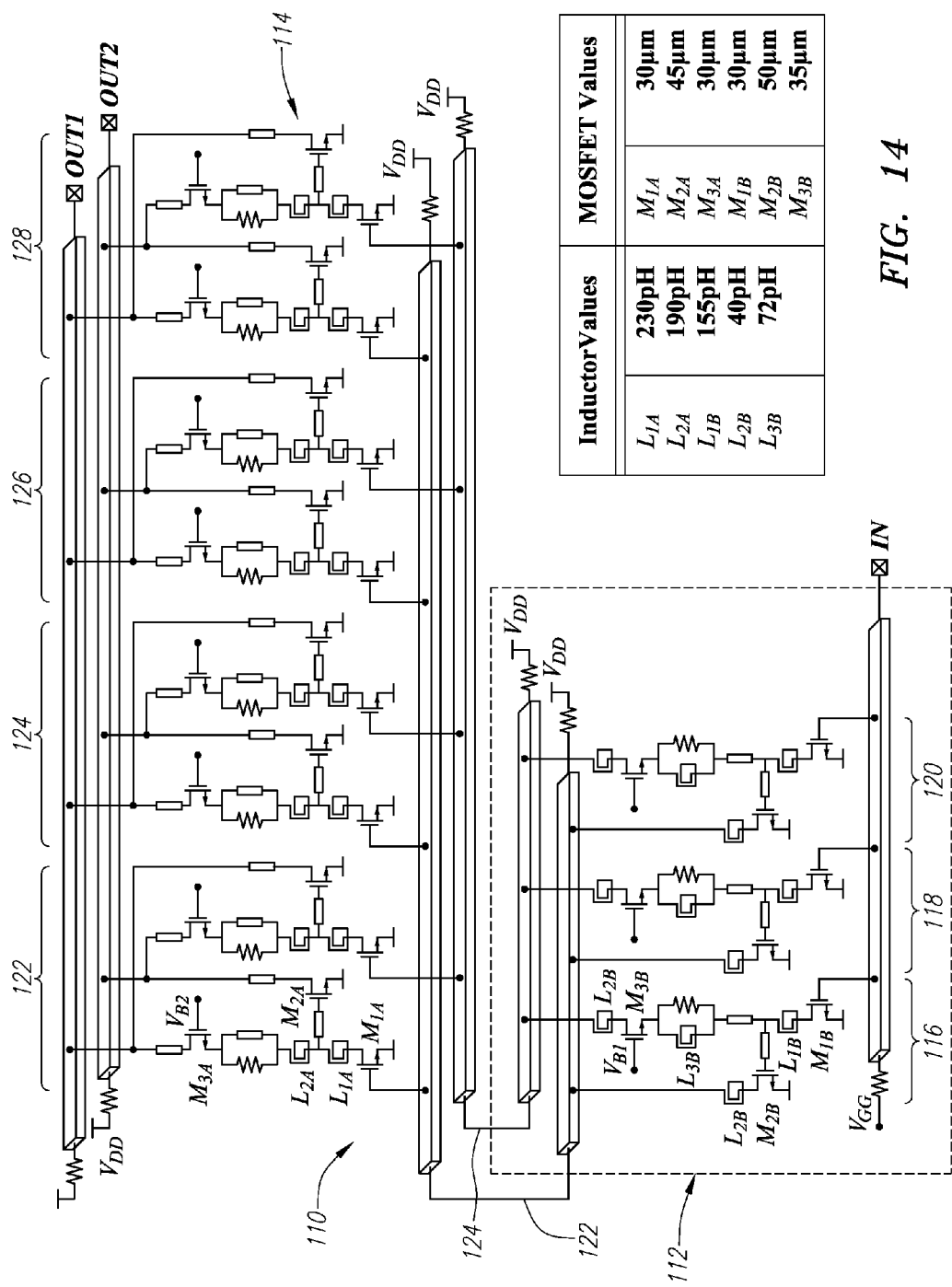
FIG. 14 is a schematic view of an exemplary embodiment of a complete distributed amplifier (along with device sizes) that is composed of a three-stage distributed balun followed by a four-stage DDA.

FIG. 14 is a schematic view of an exemplary embodiment of a distributed amplifier 110 (along with device sizes) that is composed of a three-stage distributed balun 112 followed by a four-stage DDA 114. The distributed amplifier 110 includes one input IN and two outputs OUT1 and OUT2.

The three-stage distributed balun 112 includes three dual-output $g_m$ cells 116, 118, 120. Each of the three dual-output $g_m$ cells 116, 118, 120 can have similar topology as the dual-output $g_m$ cell 60 shown in FIG. 8. The input node of each of the three dual-output $g_m$ cells 116, 118, 120 can be tied together to the input IN. The first output node of each of the three dual-output $g_m$ cells 116, 118, 120 can be tied together to form a first intermediate node 122. The second output node of each of the three dual-output $g_m$ cells 116, 118, 120 can be tied together to form a second intermediate node 124.

The four-stage DDA 114 includes four fully differential $g_m$ cells 122, 124, 126, 128. Each of the four fully differential $g_m$ cells 122, 124, 126, 128 can have similar topology as the fully differential $g_m$ cell 100 shown in FIG. 11. The first input node of each of the four fully differential $g_m$ cells 122, 124, 126, 128 can be connected to the first intermediate node 122. The second input node of each of the four fully differential $g_m$ cells 122, 124, 126, 128 can be connected to the second intermediate node 124. The first output node of each of the four fully differential $g_m$ cells 122, 124, 126, 128 can be connected together to form the first output OUT1. The second output node of each of the four fully differential $g_m$ cells 122, 124, 126, 128 can be connected together to form the second output OUT2.

In another embodiment, the distributed balun can include a different number of dual-output $g_m$ cells. For example, the number of the dual-output $g_m$ cells can be 1, 2, 4, or other numbers. Yet in another embodiment, the DDA can include a different number of fully differential $g_m$ cells. For example, the number of the fully differential $g_m$ cells can be 1, 2, 3, or other numbers.

In the exemplary embodiment of FIG. 14, $V_{B1}=V_{B2}=1.2V$ and $V_{GG}=0.7V$. The circuit 110 preferably uses differential coplanar waveguides (CPWs) as transmission lines with signal lines on top Al metal, ground walls on all metals, and slotted ground shield on lowest metal.

Figure 15:
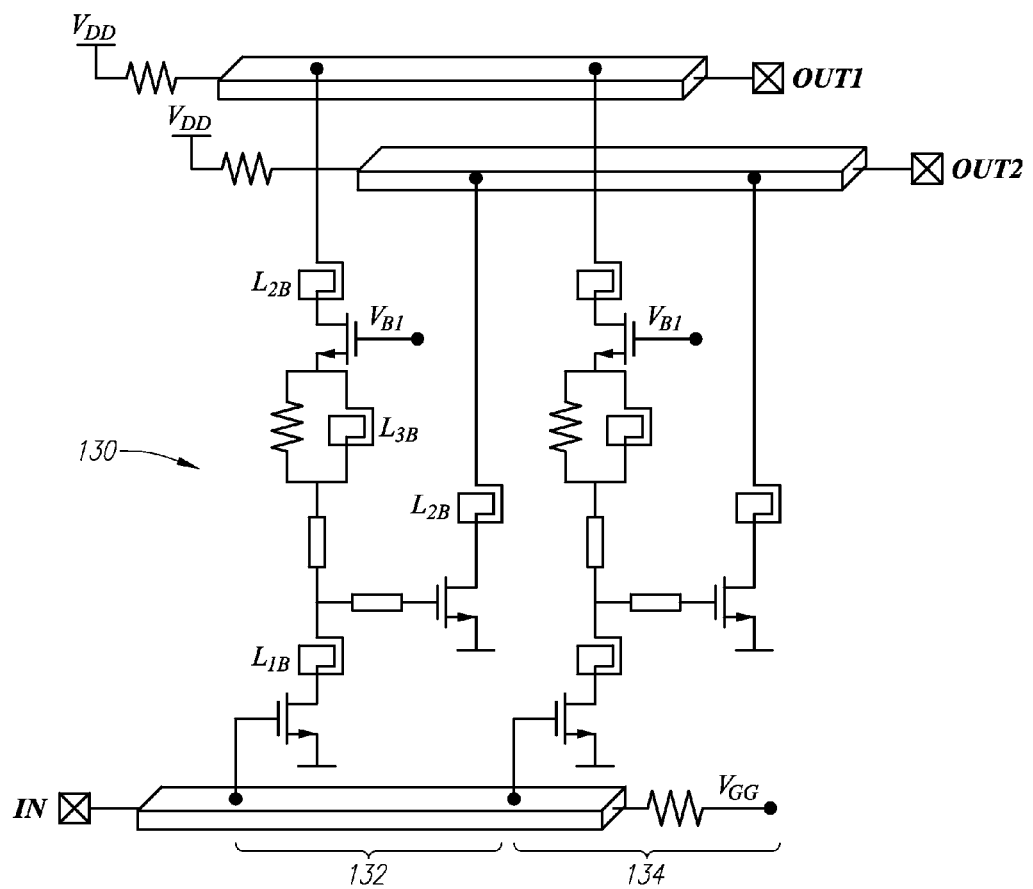
FIG. 15 is a schematic view of an exemplary embodiment of a standalone two-stage distributed balun.

FIG. 15 is a schematic view of an exemplary embodiment of a standalone two-stage distributed balun 130. The standalone two-stage distributed balun 130 includes two dual-output $g_m$ cells 132, 134. Each of the two dual-output $g_m$ cells 132, 134 can have similar topology as the dual-output $g_m$ cell 60 shown in FIG. 8. The input node of each of the two dual-output $g_m$ cells 132, 134 can be connected together to the input IN. The first output node of each of the two dual-output $g_m$ cells 132, 134 can be connected together to form the first output OUT1. The second output node of each of the two dual-output $g_m$ cells 132, 134 can be connected together to form the second output OUT2.

In another embodiment, the standalone distributed balun can include a different number of dual-output $g_m$ cells. For example, the number of the dual-output $g_m$ cells can be 1, 3, 4, or other numbers.

To achieve impedance matching, the DDA 114 and the balun 112 in the exemplary embodiment of FIG. 14 preferably have equal characteristic impedance $(Z_0=(L/C)^{1/2}=50\Omega)$. Since the DDA 114 is the main provider of gain, and thus contains larger transistors with larger parasitic input/output capacitances, its CPWs is preferably to be longer to allow for higher inductance. These CPWs preferably be carefully bent using 45° line breaks so that the DDA is not overextended in one dimension.

The distributed amplifier 110 and balun 130 CPWs preferably have $f_{3dB}$ of 93 GHz and 118 GHz and unloaded $Z_0$ of 87Ω and 84Ω, respectively. The balun output and the DDA input preferably are dc coupled to avoid the degrading effects of an ac coupling capacitor.

The spiral inductors and interconnects inside the $g_m$ cells are preferably implemented in a top Cu-thick metal layer to minimize loss. The inductors are preferably all octagonal spirals smaller than 70 μm in diameter, with an inductance of 40–220 pH and a maximum Q close to 20. The approximate spiral inductor values are shown in the table in FIG. 14. The inductances lower than 35 pH (approximate value) can be realized using transmission lines.

All CPWs, inductors, transmission lines, and interconnects can be electromagnetic (EM) simulated using a Sonnet planar EM simulator to accurately capture high-frequency effects. Moreover, all inductors and interconnects within any $g_m$ cell can be EM simulated together as a complex multi-port structure to capture and minimize any parasitic mutual coupling that could degrade performance at high frequencies.

The distributed amplifier 110 and standalone balun 130 can be fabricated in a 65 nm low-power (LP) CMOS process with $f_T/f_{max}=160/200$ GHz and $V_{DD}=1.3V$. Two 65 GHz bias tees can be connected at the output and one at the input to isolate the dc biases of these nodes from equipment ports.

Figure 16:
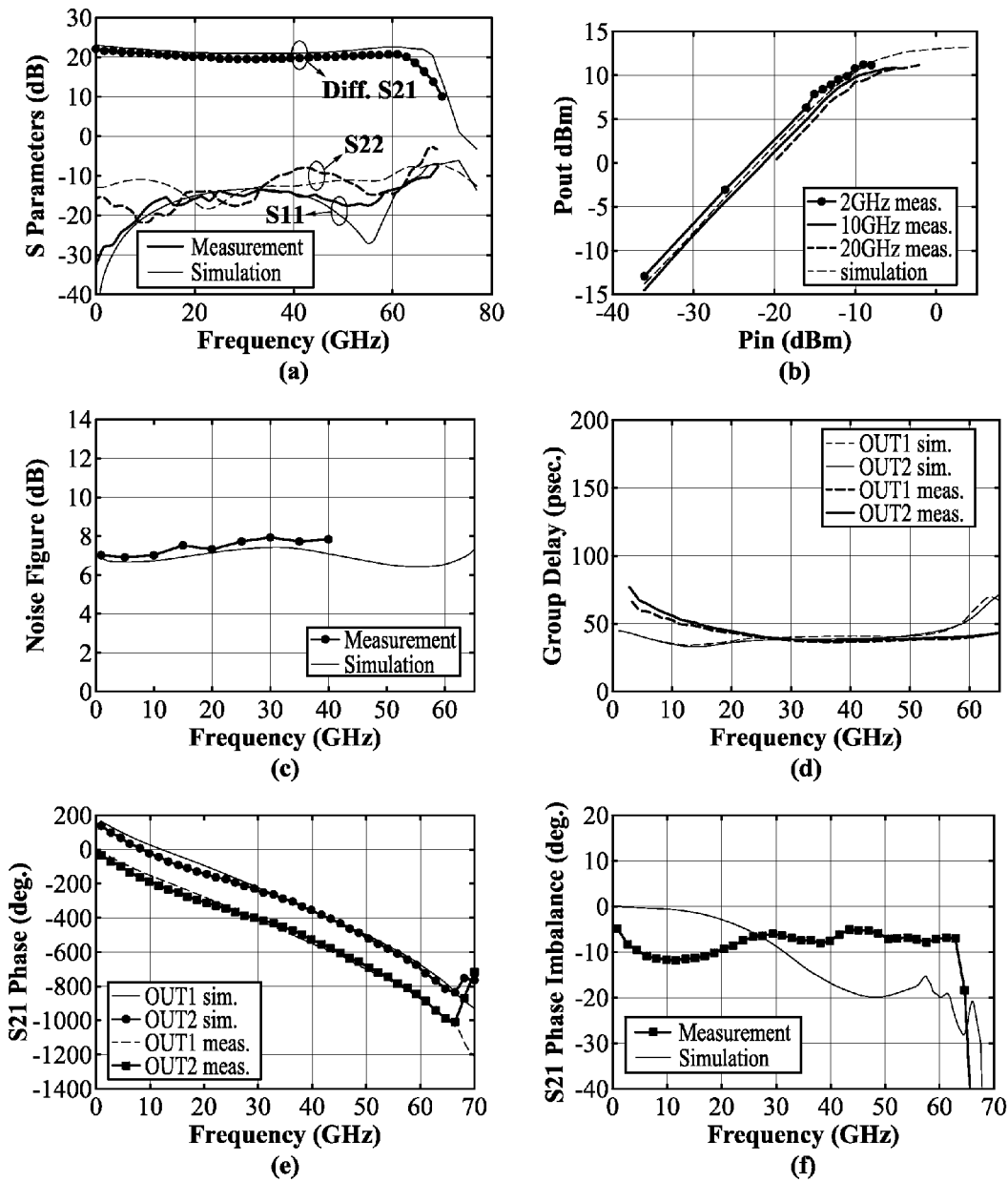
FIGS. 16(a)-(f) depict comparisons between measured results and SPICE simulations results for the distributed amplifier of FIG. 14.

FIGS. 16(a)-(f) depict comparisons between measured results and SPICE simulations results for the distributed amplifier 110. Both measured and simulated S-parameters of the distributed amplifier are shown in FIG. 16(a). The distributed amplifier 110 has a measured in-band voltage gain of 22 dB and an $S_{11}$ less than −10 dB. The voltage gain stays within 3 dB of its low-frequency value for frequencies up to 65 GHz. It is found from s-parameter curves in FIG. 16(a) that the distributed amplifier 110 is stable across the bandwidth.

FIG. 16(b) shows measured and simulated transfer curves of the distributed amplifier 110 for 2 GHz, 10 GHz, and 20 GHz input tones, where an average measured differential output $P_{1dB}$ of 10 dBm is reported.

The noise figure of the distributed amplifier 110, measured using a 40 GHz noise source, is depicted in FIG. 16(c), where a measured in-band noise figure of 7 dB is achieved up to 40 GHz.

FIG. 16(d) shows measured and simulated group delay versus frequency. The relatively flat group delay of around 40 ps proves high phase linearity across the band. In FIG. 16(d), the group delay at low frequencies is adversely affected by the input/output dc coupling capacitors of the bias tees.

FIG. 16(e) shows measured and simulated phase responses of the transfer functions for two main outputs of the distributed amplifier 110. Both measured and simulated responses show almost linear phase response.

The phase imbalance of the two phase responses, shown in FIG. 16(f), demonstrates less than 12 of phase imbalance over the entire frequency range.

Figure 17:
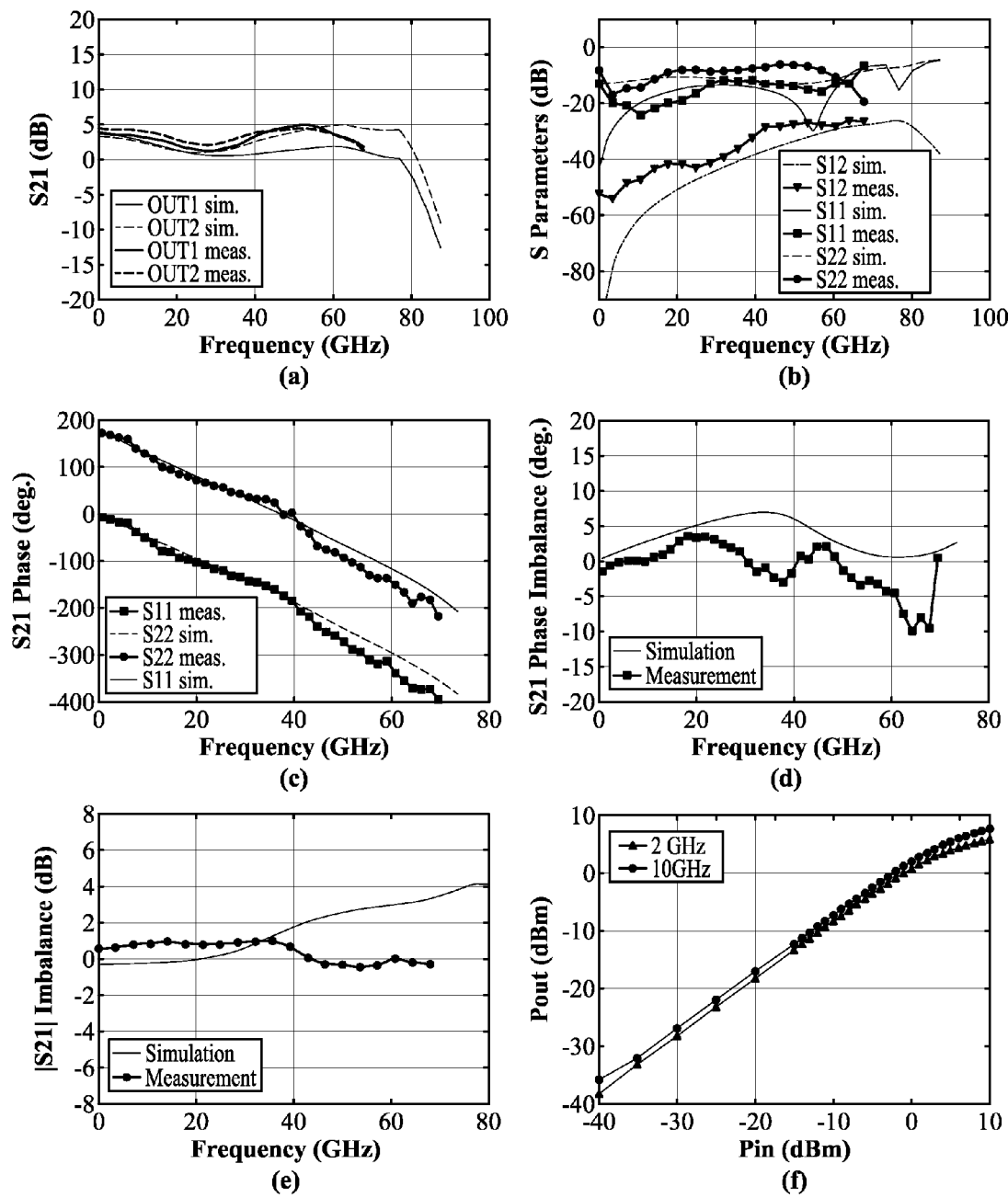
FIGS. 17(a)-(f) depict comparisons between measured results and SPICE simulations results for the distributed balun of FIG. 15.

FIGS. 17(a)-(f) depict comparisons between measured results and SPICE simulations results for the standalone balun 130. In FIG. 17, a measured voltage gain of 4 dB and a measured $S_{11}$ of less than −10 dB are reported. The measured bandwidth of the balun 130 exceeds (and is thus limited by) the bandwidth of test equipment, which is 70 GHz. FIG. 17(a), however, shows a simulated bandwidth of around 80 GHz. FIG. 17(b) depicts s-parameter curves for the standalone balun 130.

Phase and gain imbalance between the two outputs is an important performance metric of baluns 130. This becomes more crucial for baluns that are structurally asymmetric such as the one described in this disclosure. The measured phase response of the balun 130 is shown in FIG. 17(c) along with the simulation result. The fabricated balun 130 exhibits phase imbalance of less than 10 across the bandwidth, as seen in FIG. 17(d). In FIG. 17(e), gain imbalance of the balun 130 is shown, which demonstrates a measured imbalance of less than 1 dB across the bandwidth. The 1-dB compression point of the balun 130 for 2 GHz and 10 GHz input tones is depicted in FIG. 17(f), which shows an output-referred $P_{1dB}$ of 2 dBm.

Tables I and II present and compare performance summary of the distributed amplifier 110 and the distributed balun 130 with prior work, respectively. Table I shows 818 GHz GBW along with high linearity for the proposed distributed amplifier 110 compared to prior art. Table II shows superior gain and bandwidth performance with lowest power consumption for the presented distributed balun 130. It also shows that despite its asymmetric structure, the balun 130 achieves low phase and gain imbalance compared to prior art. The input balun and the DDA 110 consume 18 mA and 57 mA current from a 1.3V supply, respectively. The overall circuit consumes 97 mW, and occupies 0.94 mm² without pads rings and 1.58 mm² with pad rings. The standalone balun 130 consumes a 15 mA current from 1.3V supply, and occupies a chip area of 0.16 mm² without pads rings and 0.64 mm² with pads rings.

TABLE I

DA MEASUREMENT RESULTS AND COMPARISON WITH PRIOR WORK

| | Technology | Gain (dB) | BW (GHz) | GBW (GHz) | NF (dB) | PldB (dBm) | Power (mW) | Supply (V) | Area (mm²) |
|---|---|---|---|---|---|---|---|---|---|
| [1] | 0.18 µm CMOS | 20 | 39.4 | 394 | — | 6.5 | 250 | 2.8 | 2.24 |
| [3] | 90 nm CMOS | 19 | 12-74 | 552* | 5.2-6 | 3.7 | 84 | 1.2 | 1.19 |
| [4] | 90 nm CMOS | 7.4 | 80 | 188 | — | — | 120 | 2.4 | 0.72 |
| [5] | 0.13 µm SiGe | 10 | 110 | 347 | — | 16.7 | 119 | 3 | 2.18 |
| [6] | 90 nm CMOS | 14 | 73.5 | 370 | — | 3.2 | 84 | 1.2 | 1.72 |
| [8] | 45 nm SOI CMOS | 9 | 92 | 259 | — | — | 73.5 | 1.2 | 0.45 |
| [9] | 0.12 µm SOI CMOS | 11 | 90 | 320 | 4.8-6.2 | 12 | 210 | 2.5 | 1.28 |
| [10] | 0.12 µm SOI CMOS | 7.8 | 4-86 | 201 | 3.6-5.0 | 10 | 130 | 2.6 | 1.05 |
| [14] | SiGe ($f_T$ = 200 GHz) | 13 | 81 | 362 | — | — | 495 | 5.5 | 1.17 |
| [16] | 0.12 µm SiGe | 10 | 102 | 323 | 5.4-14.3 | — | 73 | 2 | 0.29 |
| [17] | 0.18 µm SiGe | 20 | 84.6 | 846 | 21 | -6.6 | 990 | -5.5 | 0.63 |
| [18] | SiGe ($f_T$ = 200 GHz) | 16 | 60 | 378 | — | 6.5 | 775 | -5 | 0.3 |
| [19] | 0.18 µm CMOS | 18.5 | 28 | 236 | — | — | 52 | 1.8 | 1.24 |
| [20] | 0.13 µm CMOS | 10.3 | 70.6 | 231 | — | 0.2 | 79.5 | 1.5 | 0.39 |
| This Work | 65 nm CMOS | 22 | 65 | 818 | 6.9-7.9 | 10 | 97 | 1.3 | 0.93 |

*BW is calculated as the difference of higher and lower 3-dB frequencies.

TABLE II

DISTRIBUTED BALUN MEASUREMENT RESULTS AND COMPARISON WITH PRIOR WORK

| | Technology | Gain (dB) | BW (GHz) | Gain Imb. (dB) | Phase Imb. (deg) | Power (mW) | Supply (V) | Area (mm²) |
|---|---|---|---|---|---|---|---|---|
| [21] | 0.25 µm SiGe | 4~20 | 0.2-22 | 0.5 | 4 | 166 | 3.3 | 0.7 |
| [22] | 0.13 µm CMOS | 0 ± 1 | 2-40 | 0.5 | 10 | 40 | 2.8 | 0.56 |
| [23] | 2 µm GaAs HBT | 2.9 ± 1.5 | 21 | 1.2 | 5 | 177 | — | 0.56 |
| [29] | 0.13 µm CMOS | 1 | 17 | 1.8 | 10 | 198.8 | 4 | 0.04 |
| [33] | 0.15 µm GaAs mHEMT | 2.5 ± 1 | 4-40 | 2 | 20 | 20 | 1 | 0.63 |
| This Work | 65 nm CMOS | 4 | >70 | 1 | 10 | 19.5 | 1.3 | 0.16 |

A distributed amplifier 110 and a distributed balun 130 have been disclosed that achieve overall gain and linearity improvement without degrading bandwidth, power consumption, and area. This is due to the use of a two-stage dual-output $g_m$ cell 60 with parallel R-L circuit for bandwidth compensation. Gain and linearity improvement is verified through comprehensive analysis, modeling, and simulations. Extensive EM simulation, as well as corner and post-layout simulation, have resulted in a good match between simulation and measurement results.

The disclosed distributed amplifier 110 is suitable as an amplifier for amplification and as a balun for single-to-differential conversion in any broadband wireless/wired communication system, for example, synchronous optical network (SONET), virtual private network (VPN), integrated service digital network (ISDN), etc.

While the invention has been described in connection with specific examples and various embodiments, it should be readily understood by those skilled in the art that many modifications and adaptations of the invention described herein are possible without departure from the spirit and scope of the invention as claimed hereinafter. Thus, it is to be clearly understood that this application is made only by way of example and not as a limitation on the scope of the invention claimed below. The description is intended to cover any variations, uses or adaptation of the invention following, in general, the principles of the invention, and including such departures from the present disclosure as come within the known and customary practice within the art to which the invention pertains.

What is claimed as new and desired to be protected by Letters Patent of the United States is:

1. A two-stage dual-output $g_m$ cell having an input, a first output and a second output, the dual-output $g_m$ cell comprising:
   a first transistor having a source, a drain, and a gate, the gate coupled to the input, the drain coupled to a first end of a first inductor;
   a second transistor having a source, a drain, and a gate, the drain of the second transistor coupled to the second output, the gate of the second transistor coupled to a second end of the first inductor and a first end of a second inductor;
   a third transistor having a source, a drain, and a gate, the drain of the third transistor coupled to the first output, and
   a parallel R-L circuit, one end of the parallel R-L circuit coupled to a second end of the second inductor, the other end of the parallel R-L circuit coupled to the source of the third transistor, wherein the parallel R-L circuit having a resistor and a third inductor connected in parallel to form a compensation network.

2. The two-stage dual-output $g_m$ cell of claim 1, wherein the R-L circuit is sized to compensate the effect of source capacitance of the third transistor.

3. The two-stage dual-output $g_m$ cell of claim 2, wherein the resistance of the R-L circuit is $1/g_{m3}$, where $g_{m3}$ is the trans conductance of the third transistor.

4. The two-stage dual output $g_m$ cell of claim 1, wherein the second transistor and the third transistor have the same gate aspect ratio.

5. A two-stage fully differential $g_m$ cell having a first input, a second input, a first output and a second output, the two-stage fully differential $g_m$ cell comprising:

a first dual-output $g_m$ cell having a first transistor, a second transistor, a third transistor, and a first compensation circuit coupled to the third transistor of the first dual-output $g_m$ cell to mitigate the effect of source capacitance of the third transistor of the first dual-output $g_m$ cell; and a second dual-output $g_m$ cell having a first transistor, a second transistor, a third transistor, and a second compensation circuit coupled to the third transistor of the second dual-output $g_m$ cell to mitigate the effect of source capacitance of the third transistor of the second dual-output $g_m$ cell.

6. The two-stage fully differential $g_m$ cell of claim 5, wherein the first output and the second output are cross-coupled to the drain of the second transistor or the third transistor in each of the first and second dual-output $g_m$ cells.

7. The two-stage fully differential $g_m$ cell of claim 5, wherein the first compensation circuit is a R-L circuit.

8. The two-stage fully differential $g_m$ cell of claim 7, wherein the R-L circuit is sized to compensate the effect of source capacitance of the third transistor of the first dual-output $g_m$ cell.

9. The two-stage fully differential $g_m$ cell of claim 8, wherein the resistance of the R-L circuit is $1/g_{m3}$ wherein $g_{m3}$ is the transconductance of the third transistor transistor of the first dual-output $g_m$ cell.

10. The two-stage fully differential $g_m$ cell of claim 5, wherein the second transistor and the third transistor in each of the first and second dual-output $g_m$ cells have the same gate aspect ratio.

11. A distributed amplifier having an input, a first output and a second output, the distributed amplifier comprising:

a multi-stage distributed fully differential distributed amplifier, the distributed amplifier has a plurality of two-stage fully differential $g_m$ cells, each of the fully differential $g_m$ cells has a first transistor, a second transistor, a third transistor, and a compensation circuit coupled to the third transistor to mitigate the effect of source capacitance of the third transistor; and a multi-stage distributed input balun, the input balun has a plurality of two-stage dual-output $g_m$ cells, each of the dual-output $g_m$ cells has a first transistor, a second transistor, a third transistor, and a compensation circuit coupled to the third transistor to mitigate the effect of source capacitance of the third transistor.

12. The distributed amplifier of claim 11, wherein the number of the plurality of two-stage fully differential $g_m$ cells is 4.

13. The distributed amplifier of claim 11, wherein the number of the plurality of two-stage dual-output $g_m$ cells is 3.

14. The distributed amplifier of claim 11, wherein the compensation circuit of the multi-stage distributed fully differential distributed amplifier is a R-L circuit.

15. The distributed amplifier of claim 14, wherein the R-L circuit is sized to compensate the effect of source capacitance of the third transistor.

16. The distributed amplifier of claim 15, wherein the resistance of the R-L circuit is $1/g_{m3}$ wherein $g_{m3}$ is the transconductance of the third transistor.

17. The distributed amplifier of claim 11, wherein the second transistor and the third transistor of each of the fully differential $g_m$ cells have the same gate aspect ratio.

18. A multi-stage distributed balun having an input, a first output and a second output, the distributed balun comprising a plurality of two-stage dual-output cells, each of the dual-output cells has a first transistor, a second transistor, a third transistor, and a compensation circuit coupled to the third transistor to mitigate the effect of source capacitance of the third transistor.

19. The multi-stage distributed balun of claim 18, wherein the number of the plurality of two-stage dual-output $g_m$ cells is two.

20. A broadband communication system equipped with the distributed amplifier according to claim 11.

21. A broadband communication system equipped with the multi-stage distributed balun according to claim 18.

* * * * *